United States Patent [19]

Nash et al.

[11] 4,070,631

[45] Jan. 24, 1978

[54] DIGITAL NOISE BLANKING CIRCUIT

[75] Inventors: Harold Garth Nash, Tempe; Jack Whitmore, Phoenix, both of Ariz.

[73] Assignee: Motorola Inc., Schaumburg, Ill.

[21] Appl. No.: 745,020

[22] Filed: Nov. 26, 1976

Related U.S. Application Data

[62] Division of Ser. No. 641,453, Dec. 17, 1975.

[51] Int. Cl.² .................. H04B 15/04; H03K 5/153
[52] U.S. Cl. ................................. 328/165; 328/162; 307/261
[58] Field of Search ............. 328/150, 165, 167, 162; 307/261

[56] References Cited

U.S. PATENT DOCUMENTS

| 3,248,560 | 4/1966 | Leonard | 328/150 X |
| 3,398,373 | 8/1968 | Caswell | 328/150 X |
| 3,524,075 | 8/1970 | Matthews et al. | 328/150 X |
| 3,678,295 | 7/1972 | Heneghan | 328/150 X |
| 3,727,131 | 4/1973 | Puckette | 307/261 |

Primary Examiner—John S. Heyman
Attorney, Agent, or Firm—Anthony J. Sarli, Jr.

[57] ABSTRACT

A digital noise blanking circuit for use in generating a single output pulse in response to a noisy signal which may include clusters of noise-induced pulses, the circuit utilizing a digital counter which is operated for a preset period of time longer than the time during which noise-induced transitional pulses may occur.

2 Claims, 4 Drawing Figures

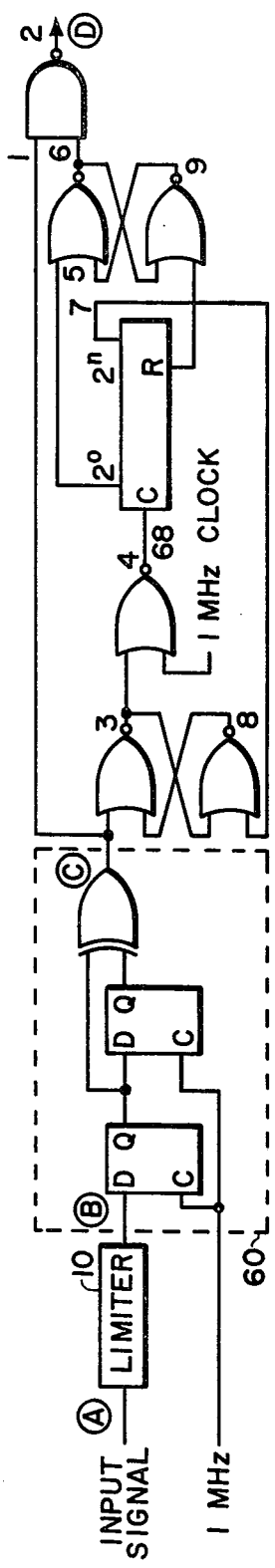
FIG. 1
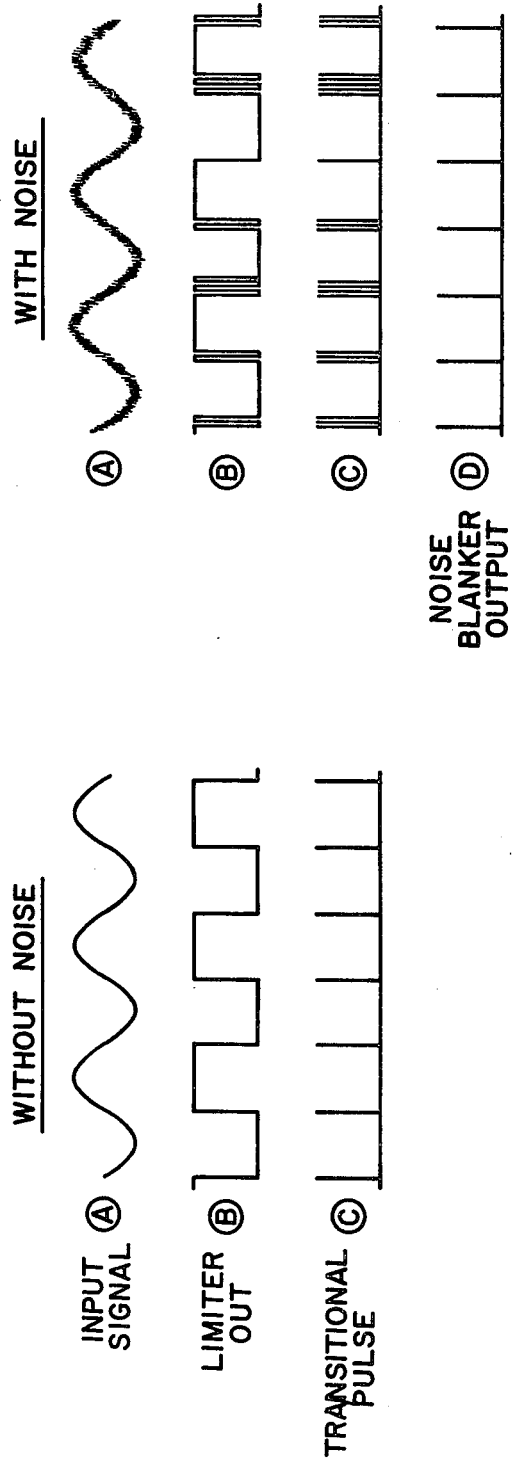
FIG. 3a
FIG. 3b

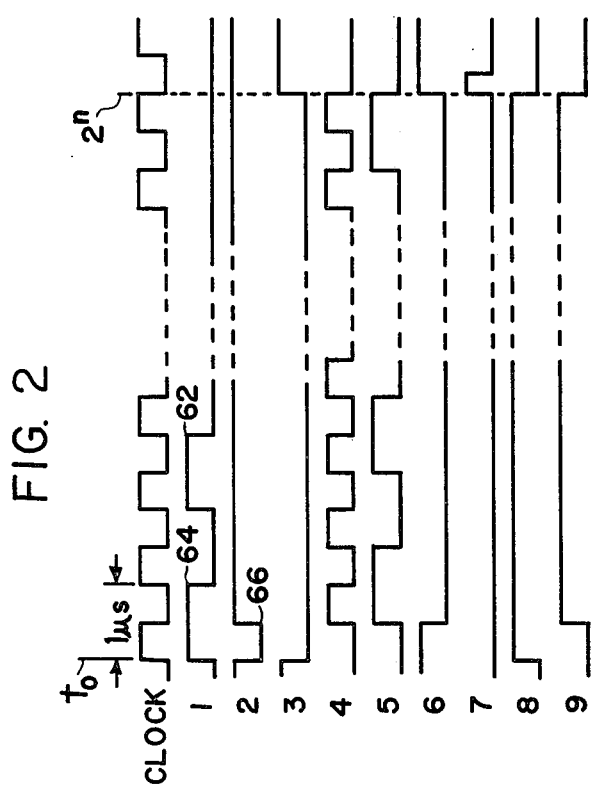

DIGITAL NOISE BLANKING CIRCUIT

This is a division of application Ser. No. 641,453, filed Dec. 17, 1975.

BACKGROUND OF THE INVENTION

This invention relates to digital noise blanking circuits, and more particularly to noise blanking circuits for eliminating from a signal false transitional pulses generated by noise while allowing one actual transitional pulse to pass.

In certain apparatus, for example tone decoders of the type described in U.S. patent application Ser. No. 641,453, filed Dec. 17, 1975, and assigned to the assignee of the instant application, it is necessary to detect the zero-axis crossing time of an analog input signal. Various means may be used to generate pulses representative of the zero-crossing time of the input signal. When noise appears on such input signal, however, additional false indications of transitions may occur, producing clusters of transitional pulses.

SUMMARY OF THE INVENTION

It is an object of the invention to provide a digital noise blanking circuit such that upon the occurrence of a transitional pulse, any additional, spurious, noise-generated transitional pulses are eliminated from the output of the blanking circuit.

Briefly described the noise blanking circuit of the invention comprises a digital N-stage counter which is started upon the occurrence of a first transitional pulse and is operated for a preset period of time sufficient to inhibit the passage of subsequent, spurious transitional pulses.

BRIEF DESCRIPTION OF THE DRAWINGS

The invention is pointed out with particularlity in the appended claims, however, other objects and advantages, together with the operation of the invention, may be better understood by reference to the following detailed description taken in connection with the following illustrations wherein:

FIG. 1 shows a noise blanking circuit according to the invention.

FIG. 2 is a timing diagram of the noise blanking circuit of FIG. 1.

FIGS. 3a and 3b show typical waveforms, in graphical representation, of the signals at various nodes of the blanking circuit of FIG. 1.

DETAILED DESCRIPTION OF THE INVENTION

In order to better illustrate the advantages of the invention and its contribution to the art, a preferred hardware embodiment of the invention will now be described in some detail.

In the U.S. Patent Application referred to above, there is disclosed a digital tone decoder which generates a frequency domain output signal in response to an incoming time domain signal. A zero-crossing detector is provided to generate pulses in response to the crossings of the zero axis of the time domain input signal. The zero-crossing detector is followed by a zero-crossing counter to generate a decode signal after the passage of a predetermined number of zero crossings of the input signal. A decoder is coupled to the zero-crossing counter to generate an output signal at output terminals in corresponding to the frequency of the incoming signal. The specific details of the system form no part of the instant invention but may be discerned by reference to that application.

In the system of the previous application, the output of the limiter to which the input signal is applied may contain noise which could possibly be interpreted by the zero crossing detector as additional zero-crossings of the input signal. To avoid the counting of these spurrious, noise-generated pulses the noise blanking circuit of the instant invention is interposed between the output of the transitional pulse generator and the input of the zero-crossing counter.

FIG. 1 shows a noise blanker circuit for use, for example, in the digital tone decoder described above, which noise blanker may be constructed of digital logic circuitry. A pair of D-Q flip-flops are connected to be responsive to an input signal from a limiter and to a clock, shown as being a 1 MHZ clock. The Q outputs of the flip-flops are connected to an exclusive OR gate from which is derived, at the output thereof indicated at node C, a series of pulses representative of the zero-crossing times of the input signal.

In the digital tone decoder the frequency detection scheme depends upon measuring the time lapse from one zero axis crossing to the next.

FIG. 3a shows a graphical representation of the waveforms present in the circuit depicted in FIG. 1 without noise. In FIG. 3a "Input Signal A" represents the input sinusoidal waveform shown at location A in FIG. 1. The waveform labelled "Limiter Out B" in FIG. 3a shows the square wave output of limiter 10. The waveform labelled "Transitional Pulse C" shows the pulsed signal generated by the first part of the noise limiter circuitry located between points B and C in FIG. 1. A single transitional pulse is generated each time Input Signal A crosses the zero level.

FIG. 3b shows effects of having an input signal with noise. Waveforms B and C of FIG. 3b correspond to those shown in FIG. 3a and show the additional affects caused by the presence of noise. The waveform labelled Noise Blanker Output D" shows the output of the noise blanker circuit 60 of FIG. 1 at location D.

FIG. 2 is a timing diagram showing the wavform of the clock signals from the one megahertz clock 20 and related waveforms produced by the portion of the noise blanker shown in FIG. 1 between locations C and D at points 1, 2, 3, . . . ,9. Reference point 62 on waveform number 1 of FIG. 2 corresponds to a pulse induced by noise. Waveform 2 which represents the output of the noise blanker circuit 60 shows that only the transition at reference number 64 on waveform 1 induces a change in state of waveform 2 as shown at reference point 66. The noise induced pulse 62 has no effect on the noise blanker output waveform 2.

As can be seen from FIG. 3a an input signal having no noise creates only a single transitional pulse per axis crossing. As shown by waveform C of FIG. 3b the addition of noise to the input signal produces mutiple transitional pulses for each true zero crossing of the input sinusoidal wave. This is caused by multiple zero crossings due to the ragged shape of the noisy sinusoidal input signal. Without the presence of the noise blanker circuit 60 these multiple transitional pulses would lock up the decoder and disable its ability to decode valid signals. The noise blanker circuit 60 allows only the first transitional pulse to be transmitted to its output.

When the noise blanker circuit 60 receives this first transitional pulse an n-stage binary counter 68 is started and runs for a preset period of time. During this preset time interval any additional transitional pulses which might occur due to noise are blanked out. Since the noise present on the input signal is random, the mean distance between each transition pulse over any given period of time correlates to that of the input signal. This results in proper detection of the unknown incoming signal.

The blanking interval is determined by the length of the counter 68 which can be programmed digitally. The optimum blanking period corresponds to a quarter cycle of the highest expected signal frequency.

It will be apparent to those skilled in the art that the disclosed digital tone decoder may be modified in numerous ways and may assume many embodiments other than the preferred forms specifically set out and described above. For example, the width of the window covered by each data latch can be either widened or narrowed from that disclosed above. In addition, the number of different frequencies which the digital tone deoder can detect can be varied. Accordingly, it is intended by the appended claims to cover all such modifications of the invention which fall within the true spirit and scope of the invention.

We claim:
1. A digital noise blanking circuit for converting a noisy time domain input signal into a series of transitional pulses comprising:
   a. first means for converting the zero axis crossings of the noisy input signal into clusters of transitional pulses,
   b. second means for generating a single transitional pulse for each of the clusters of transitional pulses,
   c. said second means including:
      1. logic circuit means; and
      2. N-stage counter means coupled to said logic circuit means for generating a single transitional pulse in response to each cluster of transitional pulses.
2. A digital noise blanking circuit for converting a noisy time domain input signal into a series of transitional pulses according to claim 1 wherein:
   a. said logic circuit means includes a latch;
   b. said n-stage counter means includes means for selectively resetting said logic circuit means.

* * * * *